United States Patent [19]

Sibata et al.

[11] Patent Number: 5,686,394
[45] Date of Patent: Nov. 11, 1997

[54] PROCESS FOR MANUFACTURING A SUPERCONDUCTING COMPOSITE

[75] Inventors: Kenichiro Sibata; Nobuyuki Sasaki; Shuji Yazu; Tetsuji Jodai, all of Hyogo, Japan

[73] Assignee: Sumitomo Electric Industries, Ltd., Osaka, Japan

[21] Appl. No.: 71,346

[22] Filed: Jun. 3, 1993

Related U.S. Application Data

[63] Continuation of Ser. No. 873,609, Apr. 22, 1992, abandoned, which is a continuation of Ser. No. 561,266, Jul. 16, 1990, abandoned, which is a continuation of Ser. No. 464,682, Jan. 16, 1990, abandoned, which is a continuation of Ser. No. 195,146, May 18, 1988, abandoned.

[30] Foreign Application Priority Data

May 18, 1987 [JP] Japan ................... 62-120821

[51] Int. Cl.$^6$ ................... H01L 39/24
[52] U.S. Cl. ................... 505/433; 29/599; 264/61; 264/63; 505/481
[58] Field of Search ................... 29/599; 264/61, 264/63; 505/430, 433, 481, 704, 740

[56] References Cited

U.S. PATENT DOCUMENTS

| | | | |
|---|---|---|---|
| 3,245,141 | 4/1966 | Gruetjen | 29/505 X |
| 3,540,114 | 11/1970 | Roberts et al. | 29/599 |
| 3,644,987 | 2/1972 | Scheffler et al. | 29/599 |
| 4,952,554 | 8/1990 | Jin et al. | 29/599 X |

FOREIGN PATENT DOCUMENTS 292126  11/1988  European Pat. Off. .

OTHER PUBLICATIONS

*Electronics*, vol. 60, No. 7, Naegele, "Superconductivity drive gets hotter every day," pp. 49–50 (Apr. 2, 1987).

*IEEE Spectrum*, vol. 25, No. 5, Fitzgerald et al, "Superconductivity: Facts vs. Fancy," pp. 31–41 (May 1988).

*Patent Abstracts of Japan*, vol. 13, No. 38 (E–709) [3457] (Jan. 1989) p. 132 & JP–A–63 237 314.

"Super Conducting of High $T_c$ Oxides", Ohmatsu et al., *Japanese Journal of Applied Physics*, vol. 26 (1987).

"Critical Current Density of Wire Type Y–Ba–Cu Oxide Superconductor," Yamada et al., May 1987.

"Preparation and Properties of High $T_c$ Superconducting Ceramics," Aselage et al., *High Temperature Superconductors*, Apr. 23, 1987.

"Fabrication of Ceramic Articles from High $T_c$ Superconducting Oxides," Johnson Jr. et al., *High Temperature Superconductors*, Apr. 23, 1987.

*Primary Examiner*—Joseph M. Gorski
*Attorney, Agent, or Firm*—Dennis P. Clarke; Kerkam, Stowell, Kondracki & Clarke, P.C.

[57] ABSTRACT

A continuous method for manufacturing an elongated superconducting campsite composed of a superconductor consisting of compound oxided and a metal sheath surrounding the superconductor, including the steps of kneading a material powder of superconducting compound oxide with a binder, continuously shaping the resulting kneaded paste into an elongated pre-form by an extruder or by coating technique, heating the pre-form continuously to remove said binder, wrapping the pre-form with a metallic sheet, and then subjecting the pre-form from wrapped with the metallic sheet to sintering operation to sinter said material powder.

14 Claims, 1 Drawing Sheet

PROCESS FOR MANUFACTURING A SUPERCONDUCTING COMPOSITE

This is a continuation of application Ser. No. 07/873,609 filed Apr. 22, 1992, now abandoned, which is a continuation of application Ser. No. 07/561,266 filed Jul. 16, 1990 (abandoned), which is a continuation of Ser. No. 07/464,682 filed Jan. 16, 1990 (abandoned), which is a continuation of Ser. No. 07/195,146 filed May 18, 1988 (abandoned).

BACKGROUND OF THE INVENTION

1. Field of the Invention

The present invention relates to a process for manufacturing a superconducting composite, more particularly it relates to a process for manufacturing an elongated superconducting composite continuously.

2. Description of the Related Art

Under the superconducting condition, the perfect diamagnetism is observed and no difference in potential is observed for all that an electric current of a constant finite value is observed internally, and hence, a variety of applications of superconductivity have been proposed in a field of electric power transmission as a mean for delivering electric power without loss.

The superconductivity can be utilized in the field of power electric applications such as MHD power generation, power transmission, electric power reservation or the like; in the field of transportation such as magnetic levitation trains or magnetically propelling ships; a high sensitive sensors or detectors for sensing very weak magnetic field, microwave, radiant ray or the like, in the medical field such as high-energy beam radiation unit; in the field of science such as NMR or high-energy physics; or in the field of fusion power generation.

In addition to the abovementioned power electric applications, the superconducting materials can be used in the field of electronics, for example, as a Josephson device which is an indispensable switching device for realizing a high-speed computer which consumes very reduced power.

However, the critical temperature could not exceed 23.2K of $Nb_3Ge$ which was the the highest Tc heretofore for all studies for the past ten years.

Possibility of existence of a new type of superconducting materials having much higher Tc was revealed by Bednorz and Müller who discovered a new oxide type superconductor in 1986 [Z. Phys. B64 (1986) 189]

It had been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These type superconductors, however, possess a rather lower transition temperature of about 10K and hence usage of liquidized helium (boiling point of 4.2K) as cryogen is indispensable to realize superconductivity.

This new oxide type superconducting material discovered by Bednorz and Müller is $[La, Ba]_2CuO_4$ which is called as the $K_2NiF_4$-type oxide having a crystal structure which is similar to known perovskite type oxide. The $K_2NiF_4$-type oxides show such higher Tc as 30K which are extremely higher than the known superconducting materials.

It was also reported in the news pater that C. W. Chu et al discovered in the United States or America another type-of superconducting material having the critical temperature of in the order of 90K in February 1987, and hence possibility of existence of high-temperature superconductors have burst on the scene.

However, the above mentioned new type superconducting materials have been studied and developed mainly in a form of sintered articles. In fact, they are produced In batch by sintering a shaped material having a predetermined dimensions in a furnace, so that no idea for manufacturing an elongated article such as a wire continuously. Still more, the resulting sintered product is not only fragile but also difficult to be deformed.

Taking the abovementioned situation into consideration, the present Inventors have proposed processes for producing sintered ceramic wires having a practically usable higher dimensional ratio of length to cross section without using organic binder which is a cause of deterioration of strength and tenacity in United State of America patent application Ser. No. 152,713 titled "Process for manufacturing a superconducting wire of compound oxide-type ceramic" filed in Feb. 5, 1988 and Ser. No. 161,480 titled "Process for manufacturing a compound oxide-type superconducting wire" filed in Feb. 28, 1988 in which a metal pipe filled with material powder is subjected to plastic deformation such as wire-drawing technique by means of a die and then is sintered.

These solutions are themselves satisfactory but the present inventors has continued to develop another process which can produce a ceramic wire possessing higher strength and no breakage and complete the present invention.

Therefore, an object of the present invention Is to overcome the abovementioned problems of the conventional technique and to provide a novel method for manufacturing an elongated superconducting wire-like composite which has high Tc, high stability as superconductor and higher dimensional stability in continuous process.

SUMMARY OF THE INVENTION

The present invention provides a method for manufacturing an elongated superconducting campsite composed of a superconductor consisting of compound oxide and a metal sheath surrounding the superconductor, including the steps of kneading a material powder of superconducting compound oxide with a binder, continuously shaping the resulting kneaded paste into an elongated pre-form by an extruder or by coating technique, heating the pre-form continuously to remove said binder, wrapping the pre-form with a metallic sheet, and then subjecting the pre-form wrapped with the metallic sheet to sintering operation to sinter said material powder.

Thus, the essence of the present invention resides in that a series of unit operations of Shaping-Binder removal-Sintering are carried out continuously. Namely, according to the present invention, a succession of operations from shaping to sintering can be carried out continuously, so that an elongated article such as a power cable or wire is manufactured advantageously.

Still more, the metallic sheath surrounding a superconductor functions not only as a support for resisting to mechanical stress but also as a bypass circuit in case that superconductivity is accidentally broken when it is used as a power cables.

The wrapping of the superconductor by the metallic sheet may be effected by means of a conventional pipe forming machine in which the metallic sheet is supplied continuously onto an advancing pre-form or sintered body through a die so that the latter is wrapped by the metallic sheet. Opposite side ends of the wrapped metallic sheet may be joined by means of seam welding technique.

The metallic sheet may be made of one of metals selected from a group of Cu, Ag, Au, Pt, Pd, Rh, Fe, Pb, Sn, Cd, Ti, W, Mo, Zr, Hf, Ta, Nb and alloys thereof. Copper and iron are preferable because they are cheap and are easy to be deformed and stainless steel may be used when corrosion resistance Is required. Ag, Pd, Rh and other precious metals are preferable in such cases when the control of the oxygen contents is required since these precious metals can release oxygen at an elevated temperature. The kind of the metallic sheath can be selected as a function of superconductors to be produced.

The superconductor has preferably a dimension in depth of less than 1.6 mm, because it is considered that superior superconductive property is observed only in the neighborhood of a surface portion of the superconductor. The preform produced from the paste composed of powder mixture and binder has preferably a thickness of less than 2 mm by taking shrinkage during the drying/heating step for removing the binder and the sintering step into account.

The superconductor which can be produced by the present invention may be in a form of a tape having a thickness of less than 2 mm and in a of a wire having a diameter of less than 2 mm. When the superconducting tape is produced, the paste composed of the powder mixture and the binder may be coated or applied on a support by means of a doctor blade. The superconducting wire is advantageously produced by an extruder.

The binder for the paste may be a mixture of polyvinylbutylal (PVB) and dibutylphthalate (DBP) as a plasticizer dissolved in toluene, or an aqueous solution of polyvinylalcohol (PVA). The binder is removed while the coated or extruded paste is heated at a temperature of 400° C. to 700° C.

The superconductor which can be produced by the present invention may be a compound oxide represented by the formula:

in which α stands for an element selected from IIa group of the Periodic Table, β stands for an element selected from IIIa group of the Periodic Table and γ stands for an element selected from a group comprising Ia, IIb, IIIb and VIII group of the Periodic Table, and w, x, y and z are numbers each satisfying ranges of $1≤x≤5$, $1≤y≤15$, $1≤z≤20$. The element α is preferably Ba and the element β is preferably at least one of Y, Ho and Dy. More specially, the superconductor is preferably Ba—Y—Cu—O system, Ba—Ho—Cu—O system or Ba—Dy—Cu—O system compound oxide which possess the quasi-perovskite type crystal structure including an orthorhombically distorted perovskite or a distorted oxygen-deficient perovskite or the like.

The abovementioned type superconductors can be prepared from a powder mixture Consisting of oxides and/or carbonates containing constituent elements of said superconductor. The powder mixture may include optionally oxides and/or carbonates of at least one of elements selected from a group comprising V, Nb, Ta, Mo, W, Ti, Cr, Mn, Ga, In, Cd, Sn, Tl, Pb and Zn at a atomic ratio of 0.01 to 0.15 with respect to said element γ. The material powder is preferably pulverized into fine particles having an average particle size of less than 10 µm.

The sintering step is preferably carried out at a temperature ranging from an upper limit which is the lowest melting point of a constituent powder in the powder mixture to a lower limit which is lower by 100° C. than the upper limit. If the sintering temperature is lower than the lower limit, complete sintering reaction can not be achieved and hence the resulting product will not have practical strength. To the contrary, if the sintering temperature exceeds the upper limit of melting point, liquid phase will be produced so that the sintered body melts or decomposed, resulting in lowering the Tc.

The present invention is also applicable to the other type superconductors including a compound oxide represented by a formula:

in which Θ is Bi or Tl, Φ is Sr when Θ is Bi and is Ba when Θ is Tl, m and n are numbers each satisfying ranges of $6≤m≤10$ and $4≤n≤8$ respectively, p=(12+2m+2n)/2, q is a number which satisfies a range of $0<q<1$, and r is a number which satisfies a range of $-2≤r≤+2$. This system is considered to be a single phase of the following compound oxide or a mixed phase consisting mainly thereof:

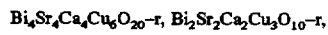

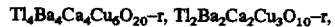

in which r is a number which satisfies a range of $-2≤r≤+2$.

Now the present invention will be described with reference to the attached drawing which illustrates an apparatus used for carrying out the present invention.

Figure 1:
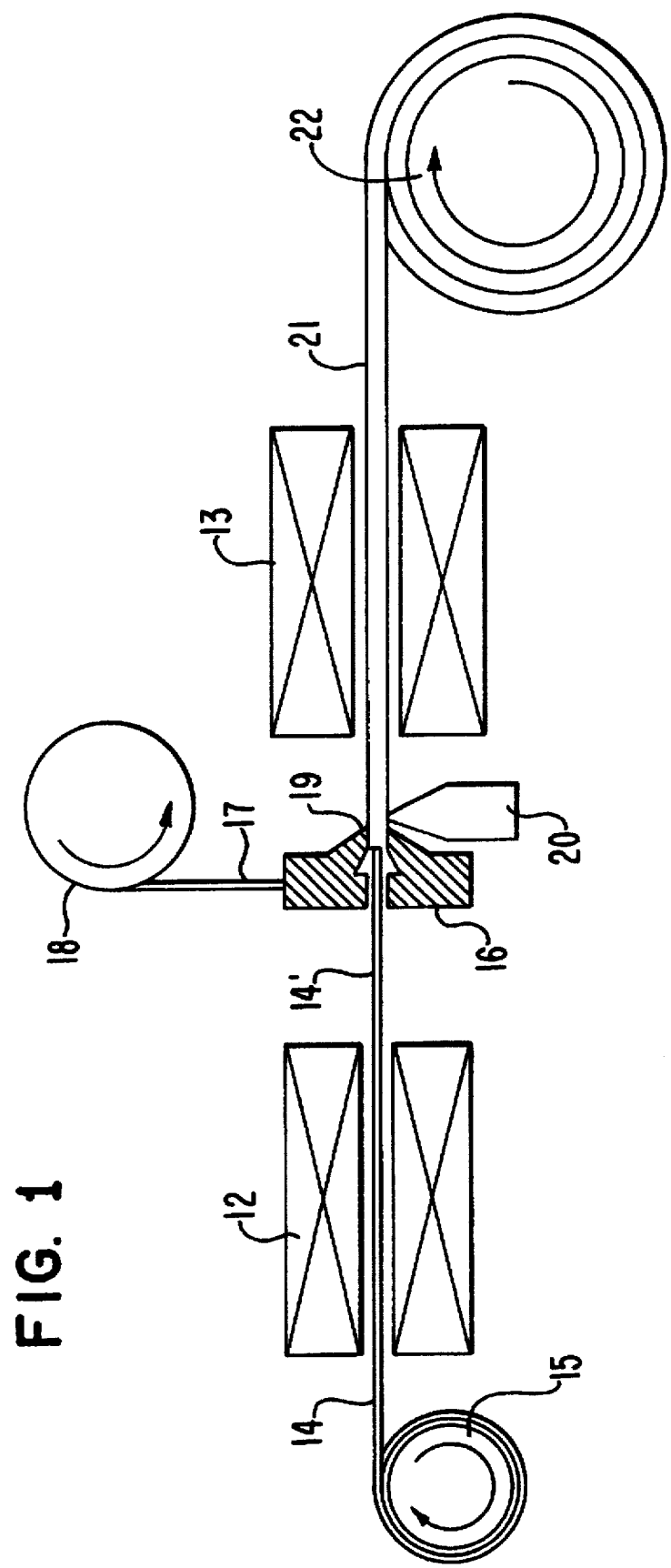
FIG. 1 is an illustrative view of an apparatus which can be used for manufacturing continuously a superconducting composite according to the present invention.

The apparatus shown in FIG. 1 includes a continuous furnace being provided with two heating means at a binder-removing zone 12 and at a sintering zone 13. All elongated pre-form 14 is produced from a paste comprising a material powder and a binder by a conventional extrusion technique or a coating technique such as a doctor blade coating process. The pre-form or a shaped tape or wire 14 is supplied to an inlet of the binder-removing zone 12 from a coiler 15. The elongated pre-form 14 unwound from the coiler 15 is fed continuously to the binder-removing zone 12 in which the elongated pre-form 14 is heated at a temperature of 400° to 700° C. to remove the binder out of the elongated pre-form 14.

After the binder-removing zone 12, the elongated article 14' is passed to a continuous lining station 16 which is positioned downstream of the binder-removing zone 12. The continuous lining station 16 is provided with a drum 18 for feeding a sheet 7 of metal or alloy to a guide 19 where the sheet 17 is wound around the elongated article 17. A seam of the wound sheet 17 is welded by means of a laser welder 20 so that the elongated article 14' is wrapped by the metal sheet 17.

The resulting composite comprising the elongated article 14' and the covering sheet or outer sheath 17 is then passed to the sintering zone 13 where the composite is heated at a temperature of 850° to 950° C. to sinter the elongated article. The longitudinal dimension or length of the sintering zone 13 and the advancing velocity of the composite can be adjusted in such a manner that the sintering is performed completely.

The product 21 thus obtained may be wound about a drum 22 for stock.

In this embodiment, the elongated pre-form 14 possesses enough flexibility and self-supporting properties, since the elongated pre-form 14 contains the binder.

The apparatus shown in FIG. 1 permits the sintering operation to be continuously carried out at higher productivity.

According to a variation of the present invention, the composite comprising the elongated article and the outer sheet can be shaped or deformed into a desired configuration such as a coil or the like due to the higher flexibility and self-supporting property, so that the sintering can be performed in the condition of the coiled configuration or in a condition that the coil is supported on any other conductive body. The existence of the sheath of metal or alloy also increases the deflective strength.

In variation, the wire-formed or tape-formed elongated composite may be shaped or deformed into a desired configuration such as a coil or a wiring line before it is passed to the sintering zone to produce a shaped superconducting article. This deformation or shaping can be effected without any damage of the material powder since the material powder is surrounded and supported by the high-strength flexible or self-supporting metallic sheet.

Now, we will describe an example of-the abovementioned process according to the present invention in reference with a special example.

At first, powders of $BaCO_3$, $Y_2O_3$, and $CuO$ each having an average particle size are mixed uniformly in such proportions that the elements Y, Ba and Cu satisfy a composition of $YBa_2Cu_3O_7$ in the final sintered body.

The powder mixture is sintered preliminarily at 900° C. for 24 hours in air to obtain a cake-like solid mass of preliminary sintered body. Then, the solid mass is pulverized by means of alumina balls in a ball mill to prepare a powder having an average particle size of 4 μm. The same procedure as the abovementioned combination of preliminary sintering and pulverization is repeated for three times.

The preliminary sintered powder thus obtained is admixed with an organic binder consisting of polyvinylbutylal (PVB) dissolved in a solvent of toluene and a plasticizer of dibutylphthalate (DBP) to prepare a paste.

Then, the resulting paste is coated on a support to prepare a sheet having a thickness of about 0.8 mm, a width of 300 mm and a length of 5 mm. After the sheet supported on the support is dried, the sheet is further heated in air at 600° C. to remove the binder.

The resulting sheet can be used directly in the abovementioned apparatus so that the sheet or pre-form is sintered finally at 960° C. for 5 hours in oxygen gas.

It is apparent from the above description that the present invention provides a process for producing an elongated superconducting article of compound oxide having higher critical temperature continuously. The metallic sheath functions not only a support to resist against mechanical stress but also functions as a bypass circuit in case that superconductivity is accidentally broken when it is used as a power cables.

What we claim are:

1. A method for manufacturing an elongated superconducting composite composed of a superconductor consisting of compound oxide and a metal sheath surrounding said superconductor, including the steps kneading a material powder of superconducting compound oxide with a binder to prepare a kneaded paste, continuously shaping said kneaded paste into an elongated pre-form by a means selected from the group consisting of an extruder and a coating apparatus, heating said pre-form continuously to remove said binder, wrapping said pre-form continuously with a metallic sheet made of Ag, and then continuously subjecting said pre-form wrapped with said metallic sheet to sintering operation to sinter said material powder at a sintering temperature between 850° C. and 950° C.; said pre-form being in the form of a tape having a thickness of less than 2 mm or in the form of a wire having a diameter of less than 2 mm.

2. The method set forth in claim 1, characterized in that said metallic sheet is fed around said pre-form after the step for removing said binder.

3. The method set forth in claim 1, characterized in that a thickness of said superconductor is less than 1.6 mm.

4. The method set forth in claim 1, characterized in that said binder contains polyvinylbutylal (PVB).

5. The method set forth in claim 4, characterized in that said binder further contains dibutylphthalate (DBP) as a plasticizer.

6. The method set forth in claim 1, characterized in that said step for removing said binder is carried out at a temperature ranging from 400° C. to 700° C. in air.

7. The method set forth in claim 1, characterized in that side margins of said metallic sheet are welded by a laser beam.

8. The method set forth in claim 1, characterized in that said material powder is a sintered powder of compound oxide obtained by the steps including sintering a powder mixture selected from a group consisting of oxides and carbonates of constituent elements of said superconductor.

9. The method set forth in claim 1, characterized in that said superconductor is a sintered compound oxide represented by the formula:

$$\alpha_w \beta_x \gamma_y O_z$$

wherein α is an element selected from Group IIa of the Periodic Table, β is an element selected from Group IIIa of the Periodic Table and γ is an element selected from one of Groups Ia, IIb, IIIb and VIII of the Periodic Table, and w, x, y and z are numbers each satisfying ranges of $1 \leq w \leq 5$, $1 \leq x \leq 5$, $1 \leq y \leq 15$, $1 \leq z \leq 20$.

10. The method set forth in claim 9, characterized in that said material powder further includes at least one of members consisting of oxides and carbonates of elements selected from a group consisting of V, Nb, Ta, Mo, W, Ti, Cr, Mn, Ga, In, Cd, Sn, Tl, Pb and Zn at an atomic ratio of 0.01 to 0.15 with respect to said element γ.

11. The method set forth in claim 9, characterized in that said material powder has an average particle size of less than 10 μm.

12. The method set forth in claim 9, characterized in that the sintering step is carried out at a temperature ranging from an upper limit which is the lowest melting point of any one of constituent powders in the powder mixture to a lower limit which is lower by 100° C. than said upper limit.

13. The method set forth in claim 9, characterized in that said element e is Ba and said element β is at least one of Y, Ho and Dy.

14. The method set forth in claim 1, characterized in that said superconductor is a sintered compound oxide represented by a composition:

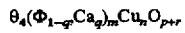

$$\theta_4(\Phi_{1-q}Ca_q)_m Cu_n O_{p+r}$$

wherein θ is Bi or Tl, Φ is Sr when θ is Bi and is Ba when θ is Tl, m and n are numbers each satisfying ranges of $6 \leq m \leq 10$ and $4 \leq n \leq 8$, respectively, $p=(12+2m+2n)/2$, q is a number which satisfies a range of $0<q<1$, and r is a number which satisfies a range of $-2 \leq r \leq +2$.

* * * * *

UNITED STATES PATENT AND TRADEMARK OFFICE
CERTIFICATE OF CORRECTION

PATENT NO. : 5,686,394
DATED : November 11, 1997
INVENTOR(S) : Kenichiro SIBATA, ET AL It is certified that error appears in the above-identified patent and that said Letters Patent is hereby corrected as shown below:

In the Abstract, line 2: delete "campsite" and insert -- composite --

In the Abstract, line 3: delete "oxided" and insert -- oxide --

In the Abstract, line 7: delete "technlque" and insert -- technique --

In the Abstract, line 10: delete "from"

Column 5, line 61 [claim 1, line 4]: after "steps" insert -- of --

Column 6, line 53 [claim 13, line 2: delete "element e" and insert -- element α --

Signed and Sealed this

Twenty-fourth Day of March, 1998

Attest:

BRUCE LEHMAN

*Attesting Officer*          *Commissioner of Patents and Trademarks*